US006709807B2

(12) United States Patent
Hallock et al.

(10) Patent No.: US 6,709,807 B2
(45) Date of Patent: Mar. 23, 2004

(54) PROCESS FOR REDUCING EDGE ROUGHNESS IN PATTERNED PHOTORESIST

(75) Inventors: John S. Hallock, Potomac, MD (US); Robert D. Mohondro, Sykesville, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/267,757

(22) Filed: Oct. 9, 2002

(65) Prior Publication Data

US 2003/0049571 A1 Mar. 13, 2003

Related U.S. Application Data

(60) Division of application No. 09/712,443, filed on Nov. 14, 2000, now Pat. No. 6,582,891, which is a continuation-in-part of application No. 09/452,878, filed on Dec. 2, 1999, now Pat. No. 6,503,693.

(51) Int. Cl.$^7$ .................................................. G03C 5/00
(52) U.S. Cl. ........................ 430/322; 430/311; 430/328; 430/330; 430/331; 430/313; 430/270.1; 430/967; 430/942
(58) Field of Search ................................ 430/311, 328, 430/330, 331, 322, 313, 270.1, 967, 942

(56) References Cited

U.S. PATENT DOCUMENTS

| 4,548,688 | A | | 10/1985 | Matthews | 204/159.18 |
|---|---|---|---|---|---|
| 5,173,393 | A | | 12/1992 | Sezi et al. | 430/323 |
| 5,347,040 | A | * | 9/1994 | Reiser et al. | 560/139 |
| 5,487,967 | A | | 1/1996 | Hutton et al. | 430/322 |
| 5,858,621 | A | | 1/1999 | Yu et al. | 430/313 |
| 5,879,856 | A | | 3/1999 | Thakeray et al. | 430/270.1 |
| 6,045,981 | A | | 4/2000 | Matsunaga et al. | 430/330 |
| 6,096,484 | A | * | 8/2000 | Azuma | 430/325 |
| 6,124,405 | A | | 9/2000 | Mertesdorf et al. | 525/312 |
| 6,127,097 | A | | 10/2000 | Bantu et al. | 430/315 |
| 6,280,908 | B1 | * | 8/2001 | Aviram et al. | 430/314 |

* cited by examiner

Primary Examiner—Mark F. Huff
Assistant Examiner—Daborah Chacko-Davis
(74) Attorney, Agent, or Firm—Watts Hoffmann

(57) ABSTRACT

A process for reducing roughness from a surface of a patterned photoresist. The process includes exposing a substrate having the patterned photoresist thereon to a vapor, wherein the vapor penetrates into and/or reacts with the surface of the photoresist. The substrate having the patterned photoresist thereon is then heated to a temperature and for a time sufficient to cause the surface of the photoresist to flow and/or react with the vapor wherein the surface roughness decreases. Optionally, the substrate is exposed to radiation during the process to increase the etch resistance of the photoresist and/or facilitate the reaction of the vapor with the surface of the photoresist.

16 Claims, 2 Drawing Sheets

PROCESS FOR REDUCING EDGE ROUGHNESS IN PATTERNED PHOTORESIST

CROSS REFERENCE TO RELATED APPLICATIONS

This application is a Divisional of Ser. No. 09/712,443 filed on Nov. 14, 2000 now U.S. Pat. No. 6,582,891.

This application is a Continuation-in-part application of, and claims priority from, U.S. patent application Ser. No. 09/452,878 entitled, "UV-Assisted Chemical Modification of Photoresist", filed on Dec. 2, 1999 now U.S. Pat. No. 6,503,693, hereby incorporated by reference in its entirety.

FIELD OF THE INVENTION

The present invention provides a process for reducing the roughness from the surfaces formed in photoresists after a relief image is patterned and developed in the photoresist. In particular, the process involves exposing the patterned photoresist to a vapor to reduce roughness from the exposed surfaces of the photoresists.

BACKGROUND OF THE INVENTION

In the course of manufacturing integrated circuits, a semiconductor wafer is typically coated with a photoresist layer. Generally, the photoresists used for this layer are organic photosensitive films used for the transfer of images and are typically exposed through a patterned photomask to a source of activating radiation such as ultraviolet light to form a latent image. The photomask has areas opaque and transparent to the activating radiation such that the photomask image is transferred to the photoresist layer. The latent image is then developed to yield a positive or negative relief image that is identical to or very similar to the photomask pattern. The photoresist layer may be positive or negative acting depending on the photoresist chemistry and developers chosen. The wafer is then further processed until the desired integrated circuit device is fabricated. The processing may be carried out according to a number of processing steps, including etching, doping and the like. Each module of the process typically requires the use of at least one patterned photoresist layer to transfer the desired properties and designs to the integrated circuit.

The relentless drive towards smaller sub-micron feature sizes in order that more and faster components may be included in a chip of a given size has created numerous technical challenges for microlithographic processing. The technical challenges include developing new materials and processes capable of accurately and reproducibly creating the desired small lithographic structures. Utilizing smaller wavelengths of radiation have made it possible to resolve smaller features. However, in order to transfer those small features into the integrated circuit it is necessary to make modifications to the photoresist chemistry.

Traditional I-line resists, based on novolac resins, have functioned well for critical dimension feature sizes down to 0.35 um. However, novolac resins are not suitable for use at the smaller wavelengths since these materials strongly absorb radiation from the wavelengths used below 365 nm. As such, in order to ensure the requisite optical transparency, new materials, such as poly(hydroxystyrene) and polyacrylates, are generally used as resins for the shorter wavelengths.

DUV photoresists resists are optimized for exposure to radiation having a wavelength at about 248 nm. DUV resists are generally based on a chemical amplification mechanism because it offers high contrast, good sensitivity and demonstrated ability to resolve patterns at 0.25 um and smaller. DUV photoresist formulations typically include a resin and a photoacid generator (PAG). Commonly used resins include modified polyvinyl phenol polymers or polyvinylphenol/acrylate copolymers in which the phenol or carboxylate groups are partially "blocked" or protected by moieties that can be chemically cleaved. As previously mentioned, these systems are typically based on an acid catalyzed mechanism wherein a strong acid is generated upon exposure to a photoacid generator compound present in the photoresist formulation to activating energy. The acid catalytically and chemically cleaves the protected group. As a result, a dissolution differential then exists between exposed (deprotected polymer) and unexposed (protected polymer) regions. It is this catalytic mechanism that is primarily responsible for the high sensitivity of these systems.

Photoresists optimized for exposure to radiation at 193 nm employ a variety of other protected polymers that necessarily contain few or no aromatic groups due to the strong absorption of 193 nm light to aromatic compounds. For example, some of these photoresists are based on acrylate polymers having various non-aromatic functional groups. Similar to DUV photoresists, these resists also utilize an amplification mechanism. The PAG chemistry of 193 nm resists is essentially the same as that of DUV resists.

At feature sizes below about 0.10 um it is anticipated that 157 nm wavelength light will be used for imaging. Photoimaging of these types of resists will likely require a vacuum since oxygen is known to strongly absorb at this wavelength. As such, a new generation of chemically amplified photoresist polymers will have to be designed to meet the challenging demands of lithography at this wavelength.

Inherent to all photoresists lithographically patterned is a phenomenon known as edge roughness, nanoedge roughness, or line edge roughness. Edge roughness refers to the irregularities or coarseness present on the surfaces of the photoresist after patterning and development. The greatest severity of edge roughness is typically observed on the sidewalls of the patterned photoresist and has a significant impact on the critical dimension budget. Edge roughness becomes increasingly important as one transitions to smaller feature sizes. For example, the critical dimension error budget targeted by lithographers for 100 nm lines is ±7 nm. If sidewall roughness for a 100 nm line causes variations of only 4 nm on either side of the targeted edge, then over half the critical dimension (CD) error budget has been used up. Edge roughness thus consumes an increasingly larger portion of the CD budget as the critical dimension of the feature shrinks. Accurate transfer of the roughness into the subsequently etched pattern will contribute to unacceptable variations in electrical performance.

There has been a great deal of effort directed towards understanding the root causes of edge roughness. The cause of edge roughness can be attributed to numerous factors. For example, edge roughness can be attributed to inadequate mask quality, poor resist performance, poor aerial image contrast near the limits of optical resolution, the plasma etch process and numerous other sources recognized by those skilled in the art. One particular class of edge roughness is associated with top surface imaging (TSI) processes based on selective silylation of the exposed resist film. Well-known problems with this approach include poor silylation contrast of the resists and low glass transition temperature, and hence higher mobility of the silylated polymer. However, in most cases other than TSI systems, edge roughness can be attributed to characteristics of the resist itself or to the lithographic processing of the image, i.e., post-exposure bake and developing conditions.

Another causal factor contributing to edge roughness is excessive acid diffusion generated upon exposure of the photoacid generator to the activating radiation at the edges of the latent image pattern, which may cause partial deprotection of the resist polymer beyond the edges. This is the main reason that so much effort has been directed at PAG design and understanding the kinetics of the deprotection reaction. Post-exposure bake conditions which drive diffusion of the photogenerated acid, can therefore have a very significant effect on edge roughness.

Another cause of edge roughness is believed to be uneven dissolution of the resist during development. Developer process conditions have been found to have a large influence on edge roughness with different effects on isolated and dense features often resulting. Several researchers have attributed this type of edge roughness to the resist polymer composition and non-homogeneous regions formed during lithographic patterning and development. For example, researchers have determined that the formation of polymer clusters during exposure and post expose bake (PEB) leads to edge roughness due to the differing solubility of the clusters and non-clustered polymers (T. Ha et al., Proc. SPIE, vol. 3999, 66 (2000)). Similarly, research has indicated that for some resists, phase separation of protected and de-protected polymers significantly enhances edge roughness (Q. Lin et al., Proc. SPIE, vol. 3999, 23 (2000)). Research has also revealed a strong dependence of edge roughness on resist polymer molecular weight and polydispersity (T. Yoshimura et al., Jpn. J. Appl. Phys., vol. 32, 6065 (1993)). More recently, researchers have discovered that not only these properties of the polymer, but also monomer ratio and the nature of the PAG influence edge roughness (S. Masuda et al., Proc. SPIE, vol. 3999, 25 (2000)).

Clearly, as noted, edge roughness can result from the complex interplay of a variety of factors. The demands on the resist formulator and lithographers to optimize several important properties simultaneously, such as resolution, sensitivity, environmental stability, etch resistance, and line edge roughness, inevitably result in compromising some properties at the expense of others. There clearly exists a great need for post lithography processes that could uniformly address all the causal factors for edge roughness.

Annealing the patterned photoresist features has been evaluated as a post lithography method to reduce edge roughness. In negative tone resists, annealing has been found to be effective for reducing edge roughness. However, it is reported that annealing deleteriously affects the feature and significantly changes the critical dimension size. (G. Reynolds, Ph.D. Dissertation, University of Wisconsin-Madison (1999)). Negative tone resists typically include a mechanism wherein the photoresist crosslinks upon exposure to activating energy and becomes insoluble in developer.

Annealing of chemically amplified, positive tone resists have also been evaluated. However, positive tone photoresists resist are more susceptible to flow deformation in an annealing process. Furthermore, thermal deprotection of these resists can occur at higher temperatures; causing release of the volatile blocking groups and concomitant shrinkage of the resist features.

Thus, there exists a need for a process for reducing the degree of edge roughness in patterned resist features without significantly affecting the critical dimensions of the feature.

It is desirable that the process be extendable to those photoresists used to pattern features less than 250 nm, i.e., photoresists optimized and sensitive for exposure to activating radiation at wavelengths of 248 nm, 193 nm, 157 nm and the like. Moreover, it is desirable that the process be amenable to reducing edge roughness in positive tone photoresists as well as negative tone photoresists. Importantly, the process should be economical, easily implemented and not dependent upon the source or causal factors of the edge roughness.

SUMMARY OF THE INVENTION

The present invention is generally directed to a process for reducing roughness from a surface of a patterned photoresist. The process includes exposing a substrate having the patterned photoresist thereon to a vapor, wherein the vapor penetrates into and/or reacts with the surface of the photoresist. The substrate having the patterned photoresist thereon is then heated to a temperature and for a time sufficient to cause the surface of the photoresist to flow and/or react with the surface wherein the surface roughness decreases. Optionally, the substrate is exposed to radiation during the process to increase the etch resistance of the photoresist and/or facilitate the reaction of the vapor with the surface of the photoresist. The invention is especially suitable for use with those photoresists used for imaging feature sizes less than about 250 nm.

In one embodiment, the process includes exposing a substrate having a patterned photoresist thereon to a vapor, wherein the vapor penetrates into the surface of the photoresist. The substrate is heated prior to, simultaneous with or after exposure of the vapor, to a temperature and for a time sufficient to cause the surface of the photoresist to flow wherein the surface roughness decreases. The vapor lowers a glass transition temperature at the surface of the photoresist relative to a glass transition temperature of a bulk of the photoresist that is free from exposure to the vapor. The vapor is selected from a material that is miscible with or at least partially miscible with at least one component in the photoresist. The temperature for heating the substrate is below a glass transition temperature for a bulk of the photoresist wherein the bulk of the photoresist is free from exposure to the vapor.

Optionally, the process further includes exposing the photoresist to activating radiation for a time and energy sufficient to increase an etching resistance of the photoresist prior to, simultaneous with or subsequent to exposing the photoresist to the vapor. The radiation that is used to expose the photoresist has a wavelength in the ultraviolet range, x-ray range or includes electrons generated from an electron beam, or the like.

The vapor can be selected from a material that is reactive or nonreactive during the process. Preferably, the vapor is generated from a material with a boiling point less than about 200° C. at standard atmospheric conditions. Examples of suitable non-reactive vapors include ketones and esters such as acetone, methyl ethyl ketone, butyl acetate, ethyl lactate and propylene glycol methyl ether acetate.

In another embodiment, the process for reducing edge roughness includes exposing a substrate having a patterned photoresist thereon to a reactive vapor. The reactive vapor diffuses into the surface of the photoresist and lowers the glass transition temperature at the surface exposed to the vapor. The substrate is heated to a temperature and for a time sufficient to cause the surface of the photoresist to flow wherein the surface roughness decreases. During the process, the patterned photoresist is exposed to an activating radiation prior to, simultaneous with or subsequent to exposing the substrate to the vapor wherein the activating energy reacts with the photoresist to generate a compound. The vapor reacts with the compound and adds mass to the photoresist. The compound is reactive with the vapor and is preferably, a free radical, a photoacid generator, a photobase generator, or the like.

The reactive vapor can be generated from a wide range of materials including but not limited, to vinyl ethers, epoxides, acrylonitriles, furans, coumarins, indenes, styrenes, acrylates, aryl halides, halosilanes, alkynes, alkenes, cyclic ethers and sulfur dioxide. The reactive vapor reacts with the photoresist during and/or after thermal flow of the surface to increase a glass transition temperature for the photoresist surface relative to a glass transition temperature of bulk photoresist wherein the bulk photoresist is free from exposure to the vapor. The reactive vapor is preferably selected to add mass to the photoresist. Preferably, the reactive vapor is generated from a liquid with a boiling point less than about 200° C. at standard atmospheric conditions. The inventive process can be used in the manufacture of integrated circuits.

Other embodiments of the invention are contemplated to provide particular features and structural variants of the basic elements. The specific embodiments referred to as well as possible variations and the various features and advantages of the invention will become better understood when considered in connection with the accompanying drawings and detailed description that follows.

DETAILED DESCRIPTION OF THE PREFERRED EMBODIMENTS

Figure 1:
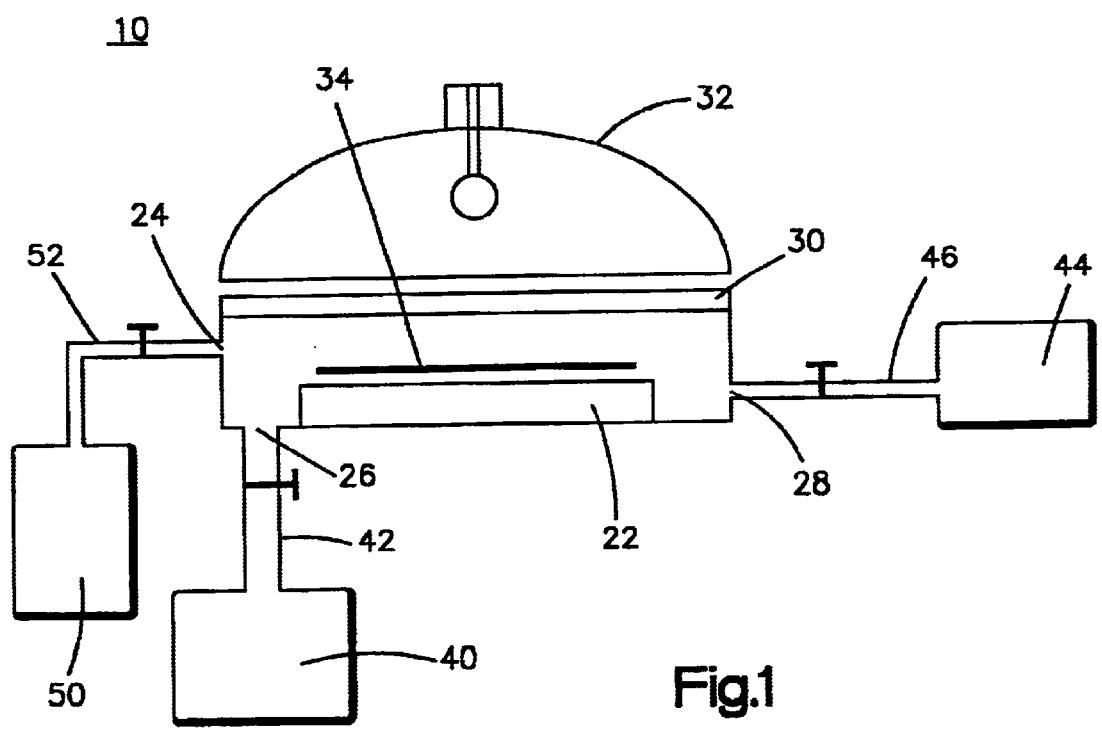
FIG. 1 shows a cross sectional view of a vapor treatment chamber suitable for use in the present invention.

The present invention is generally directed to a process for reducing edge roughness from surfaces of patterned photoresists. Edge roughness, also referred to as line edge roughness or nanoroughness, is hereinafter defined as irregularities or coarseness present on the surfaces of the photoresist after patterning and development. The greatest severity of edge roughness is typically observed on the sidewalls of the patterned photoresist and has a significant impact on the critical dimension budget. According to standard practice, there is typically employed by those in the art a critical dimension budget of +/−10 percent of the targeted feature size. For example, if the critical dimension feature size are 250 nm nested lines, the budget accorded to this critical dimension is +/−25 nm for each individual line. The budget represents the permissible amount of deviation from nominal that would still allow the manufacturer to produce an integrated circuit with the desired performance specifications. Thus, in the above noted example, if the image transferred from the photomask to the photoresist is greater than 275 nm, the budget would be exceeded and targeted device performance would not be met.

Depending on the lithographic process parameters employed, edge roughness can be controlled to some extent in the patterned photoresist. However, it is expected that some degree of edge roughness will be present after developing the latent image formed in the photoresist. Current lithographic processing technology does not provide any processes for rendering smooth the surfaces of the patterned photoresist. The amount of edge roughness is especially problematic in manufacturing integrated circuits as one transitions to smaller targeted feature sizes for improved performance. As the critical dimensions decrease, the overall percentage of surface roughness for the critical dimension increases since the degree of roughness present on the surfaces of the developed photoresist is relatively constant. The present invention provides a process that decreases the degree of surface roughness present in the patterned photoresist without deleteriously affecting the critical dimension. Consequently, the inventive process advantageously permits a larger process window to exist.

The invention is especially suitable for use with those photoresists used for defining features with a critical dimension less than 0.25 um.

The process generally comprises exposing the patterned photoresist to a vapor and then heating the substrate having the photoresist thereon to a temperature and for a time sufficient to decrease edge roughness at the surfaces. Optionally, the vapor and/or photoresist may be exposed during the process to activating radiation to facilitate the process for decreasing roughness from the patterned photoresist surfaces.

The vapor may be reactive or nonreactive with the photoresist depending on the choice of material selected to generate the vapor. In the case of a non-reactive vapor, the vapor penetrates into the surface of the photoresist and is believed to lower the glass transition temperature ($T_g$) at the surface of the photoresist such that the surface $T_g$ is lower than a glass transition temperature for a bulk of the photoresist. That is, the surface $T_g$ is lower than the $T_g$ for the photoresist that was not exposed to any vapor. Subsequent heating of the photoresist at a temperature at or above the surface $T_g$ causes the surface of the photoresist to flow and smooth out the surface irregularities. The flow of the photoresist can be controlled on a microscopic scale based on the parameters and materials selected for the process. That is, the depth of penetration of the solvent in the surface of the photoresist can be controlled and limited to the depth of the surface of irregularities such that subsequent flow of the exposed areas renders the surface smooth. It is preferred that the temperatures selected for selectively flowing the photoresist surface are below the $T_g$ of the bulk photoresist or are for a time such that flow of the bulk photoresist is minimal and does not deleteriously affect the targeted critical dimension of the photoresist feature. The temperature used for heating the photoresist surface may be constant or variable. Typically, the temperatures used for flowing the photoresist surface are from about 20° C. to about 250° C. The total time and temperature used is dependent on the photoresist thermal properties and the determination thereof is well within the skill of those in the art to optimize.

The particular components of the non-reactive vapor are selected by their ability to form a vapor at vapor forming conditions and their ability to penetrate into the surface of the photoresist. Accordingly, the vapor can be a single material or a mixture generated from a solid, liquid or gas. Preferably, the vapor is a solvent or co-solvent for the polymer used in the photoresist. However, in some cases, it is desirable and advantageous to employ a material with which at least one of the components in the photoresist is only marginally soluble or miscible. It has been found that this will help control the extent of vapor penetration and subsequent plasticization. The solid, liquid and/or gas materials are exposed to a temperature and/or pressure sufficient to maintain the selected material in its vapor phase. The range of vapor pressures suitable for use in the present invention is in a range from about 1 atm to about 760 atm. In practice, preferred materials are liquids with a boiling point less than 200° C. at standard atmospheric pressure. Examples of suitable solvents for forming the vapor include, but are not limited to, ketones such as acetone, methyl ethyl ketone, and esters such as butyl acetate, ethyl lactate and propylene glycol methyl ether acetate. Other materials suitable for use in the present invention will be apparent to one skilled in the art in view of this disclosure.

Exposure to the vapor may be limited by time and/or by concentration (vapor pressure). The effect of such permeation and penetration into the surface of the photoresist will be to selectively lower the $T_g$ at the surface via a plasticization of the polymer chains. Solvent plasticization is a well-known phenomena known to those skilled in the art to lower the $T_g$ of polymers. This in turn will allow the polymer chains to flow in the vapor-permeated region at a lower temperature than that of the bulk resist.

The use of an optional hardbake or photostabilization step to increase etch resistance can be included in the process before, during or after exposure of the photoresist to the non-reactive vapor. The hardbake or photostabilization process results in an advantageous increase in etch resistance believed to be caused by an increase in crosslink density within the photoresist and/or a decrease in free volume within photoresist. One such photostabilization process for increasing etch resistance is disclosed in U.S. Pat. No. 4,548,688, entitled "Hardening of Photoresist", which is incorporated herein by reference in its entirety. The photostabilization process generally includes exposing the photoresist to UV radiation at an elevated temperature. The elevated temperature at any instant during exposure to the radiation is kept below the glass transition temperature for the resist. Careful control of the amount of UV radiation is required during photostabilization since it is possible, depending upon the photoresist chemistry, to cause the patterned photoresist to shrink. The UV radiation or other form of energy may have a constant or variable intensity typically ranging from about 10 mW to about 1W. Since most photoresists used for patterning features below 0.25 um utilize a chemical amplification mechanism based upon photogeneration of a strong acid to cleave protective groups in order to effect a solubility differential for subsequent development, it is possible that photostabilization will generate an amount of acid within the patterned photoresist that will cause the loss of functional protective groups present on the polymer used for the photoresist. The protective groups are typically volatile and do not remain in the photoresist whereby the patterned photoresist shrinks as a result of a loss in molecular weight due to loss of the protective groups. Thus, careful control of the amount and wavelength of radiation is required to minimize shrinkage.

In another embodiment of the process, the patterned photoresist is exposed to a reactive vapor. As with the non-reactive vapors, the reactive vapor initially diffuses into and begins to plasticize a surface of the photoresist. Heating the photoresist to a temperature at or above the surface Tg and below the bulk photoresist Tg during the initial diffusion of the reactive vapor will cause the photoresist surface to selectively flow and decrease the roughness associated with the surface. However, unlike the non-reactive vapors, the reactive vapor is selected from a material that will self react under certain conditions or react from contact with one or more components of the photoresist.

Like the nonreactive vapor, the particular components of the reactive vapor are selected by their ability to form a vapor at vapor forming conditions and their ability to penetrate into the surface of the photoresist. Accordingly, the reactive vapor can be a single material or a mixture generated from a solid, liquid and/or gas. Preferably, the reactive vapor is soluble to some extent with at least one component in the photoresist. The solid, liquid and/or gas material is exposed to a temperature and/or pressure sufficient to maintain the material in its vapor phase without undergoing any self initiated reaction. It is only after the reactive vapor has diffused into the surfaces of the photoresist that reaction will occur. The range of vapor pressures suitable for use in the present invention is between from about 1 atm to about 760 atm. In practice, preferred materials are liquids with a boiling point less than 200° C. at standard atmospheric pressure.

The reactive vapor can be one of a number of different reactive type materials. For example, the vapor can be selected from materials that are acid sensitive. That is, the reactive vapor upon contact with an acid will undergo self-polymerization or will react with one or more of the components found in the photoresist. As recognized in the art, chemically amplified photoresists are commonly used for defining feature sizes less than 0.25 um. Most chemically amplified photoresist systems are based on an acid catalyzed mechanism in which a strong acid is generated from a photoacid generator (PAG) during exposure to activating energy. The acid generated catalytically cleaves protective group(s) from the base polymer in the photoresist to cause a differential in dissolution behavior between exposed and unexposed regions during subsequent development. As such, the exposed areas of photoresist can be differentiated and selectively developed from the unexposed areas. Trace amounts of residual acid are present in the patterned photoresist after development and can function as a catalyst for vapor polymerization such that a depth of the vapor diffusion into the photoresist surface is limited.

Optionally, the patterned chemically amplified photoresist may be blanket exposed to activating radiation to cause further generation of acid within the patterned photoresist. The reactive vapor reacts and polymerizes as it diffuses into the photoresist thereby limiting the degree of penetration Accordingly, the acid generated within the photoresist offers a self-limiting mechanism for causing slight flow initially at the resist surface in order to cause a smoothing of the edge roughness and then halting the flow before gross deformation of the resist takes place.

While the applicability of the invention to chemically amplified systems based on acid generation has been discussed, the invention is not limited to photoresists with acid amplification mechanisms. Some photoresists include photobasic compounds that generate a basic compound during lithographic processing. In this case, the vapor is selected to be reactive with the basic compound generated. Moreover, exposure of radiation to the photoresist can cause the generation of free radicals within the photoresist itself that can then be used to react with the reactive vapor. Chain scission of the polymer used in the photoresist may generate radicals, e.g., phenyl radicals. The radicals can then react with the vapor. Still yet, the initiation of polymerization of monomers can be caused by UV irradiation alone. In either case, absorption of the reactive vapor into the photoresist surface followed by UV irradiation will cause the formation of free radicals that can initiate polymerization, thereby fixing the adsorbed vapor into the resist structure.

As noted, monomers are suitable for use as a reactive vapor in the present invention. Examples of monomers suitable for acid-catalyzed polymerization include monomers having at least one vinyl group. For example, methyl vinyl ether, ethyl vinyl ether, acrylonitrile, methyl methacrylate, tert-butyl vinyl ether, 2,3-dihydrofuran, phenyl vinyl ether, styrene, indene, and benzofuran. Vinyl ether compounds are especially suitable for polymerization initiated by a strong acid catalyst. Other vinyl compounds suitable for use in the present invention will be well within the skill of those in the art in view of this disclosure. Prior, simultaneous or subsequent generation of strong acid from photoinduced decomposition of the pliotoacid generator in some types of chemically amplified photoresists initiates polymerization and/or addition to the photoresist polymer. In the case of di- or multi-functional monomers some crosslinking may also occur.

Another class of monomers capable of undergoing acid-catalyzed polymerization and/or addition to the photoresist polymer consists of epoxy-functional chemicals. Examples of epoxies suitable for use in the present invention include, but are not limited to, (2,3-epoxypropyl)benzene, ethylene oxide, and propylene oxide. Other epoxies will be apparent to those skilled in the art in view of this disclosure.

Examples of such monomers that readily undergo free radical polymerization include various acrylates, styrenes, and acrylonitriles. Other materials suitable for free radical polymerization in accordance with the present invention will be apparent to those skilled in the art in view of this disclosure.

Advantageously, it has been found that the glass transition temperature of the surface can increase depending on the choice of reactive vapor. As the patterned photoresist is exposed to the reactive vapor, the vapor penetrates and diffuses into the surface of the patterned photoresist. Initially, the diffusion of vapor into the photoresist surfaces decreases the Tg at the surface where exposure occurred. However, as the vapor reacts with and polymerizes upon contact with the residual acid and/or free radical, an increase in Tg can be made to occur. As such, the depth of reactive vapor penetration into the surface can be controlled since polymerization may prevent further penetration and diffusion of reactive vapor. Advantageously, by careful selection of the reactive vapor, the reaction with the photoresist can increase the etch resistance of the photoresist by increasing the amount of carbon to hydrogen present in the photoresist. Those skilled in the art will recognize that an indication of etch resistance can be determined by the ratio.

The process of using a reactive vapor may further include a hardbake or photostabilization process to increase the etch resistance, i.e., increasing crosslinking density of the photoresist features prior to vapor treatment and/or minimizing the free volume in the photoresist. As previously noted, one of the problems with photostabilization of chemically amplified resists systems is the propensity for shrinkage. Use of a reactive vapor can counteract shrinkage since the process can be optimized to control the amount of vapor diffused into the photoresist. If shrinkage is severe the amount of reactive vapor diffusing into the resist can be increased to cause the resist to swell. For example, the vapor pressure can be increased. As such, crosslinking and reactive swelling may be made to take place simultaneously in a manner where the actual feature dimensions never undergo appreciable change in spite of the chemical changes taking place, or they may take place sequentially, e.g., crosslinking (and shrinking) first, then swelling back to the original size with the reactive solvent. In another process meeting the requirements of this invention, any of a variety of vinyl type monomers which are solvents for the photoresist phase(s) and which are capable of polymerization and/or addition to reactive groups on the photoresist polymer, are diffused into the photoresist.

A distinct advantage to the use of monomers that are capable of self-polymerizing is that there are no stoichiometric limitations. Complete reaction can take place regardless of the quantity of material diffused into the resist, thus providing greater control over critical dimensions. In contrast, reactive vapors that react stoichiometrically with functional groups on the photoresist polymer may not be sufficient to counteract shrinkage since the numbers of functional groups present on the photoresist polymer are limited.

The process is applicable to decreasing surface roughness from photoresist features wherein the surface roughness is caused by poor aerial image quality, optical effects or the like, or wherein the surface roughness is caused by the formation of non-homogeneous polymer domains near the surface of the photoresist. The main components of photoresists are polymers or copolymers that have different protective moieties designed to deprotect under certain conditions. For example, DUV photoresists are comprised of polyvinyl phenols wherein the phenol is blocked with an acid sensitive protective group or is a polyvinylphenol acrylate copolymer with acid sensitive protective groups. Removing the protective groups during lithographic processing generates the phenol, or carboxylic acid or the like, which renders these types of polymers soluble in aqueous basic developer. Developers used in the development of the latent image are typically chosen based on the bulk dissolution properties for the exposed and unexposed photoresist. Near the interface between the exposed and unexposed regions there is often a boundary layer consisting of protected polymer chains and (partially) deprotected polymer chains which were not removed by the developer. These immiscible polymer domains form clusters that result in surface roughness. The photoresist pattern is treated with a reactive vapor capable of reacting with the de-protected groups on the polymer and in the process re-protecting them. In this manner all of the polymer chains within the resist features may now become miscible and upon appropriate application of heat will become homogenized. As a result, heating at or above the Tg for the resist surface and below the Tg for the bulk photoresist will cause concomitant flow at the surface to decrease roughness.

In many cases, even if a relatively smooth sidewall profile is obtained after exposure and development, the non-homogeneous quality of the resist results in local variations in resist erosion rates during the subsequent plasma etch steps. This results in etch induced surface roughness. Depending on the choice of reactive vapor and processing conditions, the vapor can be chosen to crosslink within the photoresist to produce a more uniform etch resistance thereby reducing line edge roughness induced by the plasma etch process. Also, the reactive vapor may be chosen so as to re-protect the functional groups in the polymer chains rendering all polymer chains homogenous and miscible.

In another embodiment all of the photoresist polymer may first be de-protected (via UV/thermal treatment) in order to confer compatibility, then treated with a reactive chemical. The (partially) deprotected polymer chains near the exposed photoresist surfaces will possess acid groups in the salted form. The counter-ion, e.g., tetramethylammonium cation, derives from the developer solution. It is desirable to rid the polymer chains of the cations in order to render the polymer chains more compatible with the deprotected bulk photoresist. In these cases, first treating the photoresist features with an excess of a mild acid, such as acetic acid, will render the polymer neutral and compatible with the bulk polymer polymer. If desirable, the salt by-product, e.g., tetramethylammonium acetate, can be rinsed away with water. This treatment may or may not be followed up with reactive vapor treatment.

A complementary method involves de-protection of all of the photoresist polymer (readily accomplished via UV/thermal treatment) and then treatment with a base such as ammonia. This will render the entire polymer in the ionomeric form and at the same time swell the polymer to counteract the shrinkage that occurs upon deprotection. Appropriate thermal treatment of the now homogeneous polymer will effect the surface smoothing. Properties of the resulting "salted" polymer can be tailored by judicious choice of base and treatment conditions. In general, ionomers usually have a higher Tg and modulus than the corresponding neutral polymers, and so the resulting photoresist features may have enhanced resistance to subsequent processes such as plasma etching or ion implant.

Referring now to FIG. 1, there is shown a vapor treatment chamber suitable for use in the present invention that is generally designated by reference numeral 10. The invention is not limited to any particular chamber construction in this or in the following embodiments. The chamber 10, as shown, includes a receptacle 20 that contains a wafer support 22, a vapor inlet 24, a vacuum port 26, a gas purge port 28 and an optional window 30. A radiation source 32 is proximate to the window 30. The radiation source preferably emits light in the ultraviolet region. However, it is possible that other wavelength regions can be used, e.g., x-rays. The wavelength of the radiation source is dependent on the desired photoreactions. The window is made from a material that is transparent to the emitted radiation. For example, a quartz window is preferably used for emission of light with a wavelength selected from the ultraviolet region. The temperature of a wafer 34 placed on the wafer support may be thermally controlled by conventional means using an external controller. A vacuum pump 40 is connected to the vacuum port by means of a conduit 42. A gas source 44 is connected to the purge gas port 28 via conduit 46. The vacuum pump advantageously removes the static atmosphere, e.g., oxygen and/or air, from the receptacle 20 in the event that the atmosphere in the receptacle causes deleterious effects on the desired reaction. Moreover, it has been found that evacuating the chamber to a certain pressure level will facilitate vapor formation for chemicals that are liquids at ambient temperatures and pressures. In addition, for safety reasons, it is desirable to purge the receptacle with a gas to remove any toxic or obnoxious gases and/or vapors present before it is vented to the atmosphere. As such, exposure to a user of potentially harmful and hazardous materials is prevented. Optionally a manometer (not shown) may be attached to the receptacle for detecting the pressure within the chamber. In this way, through control of the temperature and pressure of the entire system, a desired vapor pressure of a chemical treatment may be maintained in the chamber and around the wafer. A tank 50 is connected by a heated conduit 52 to the vapor inlet 24. The tank 50 preferably includes conventional means for heating and pressurizing the tank for generating the vapor.

In operation, a semiconductor wafer 34 with patterned photoresist thereon is placed into the chamber 10 on the wafer support 22. The pressure within the reaction chamber is reduced or increased to an amount sufficient to maintain the vapor in vapor form. The vapor is fed into the chamber via the vapor inlet 24. Preferably, the vapor is heated externally in a heated conduit 52 connected to the chamber. It is preferred that the vapor penetrate the surface of the photoresist to a depth sufficient to remove roughness present on the surface. Of course, depending on the degree of edge roughness the amount of vapor penetration can be easily optimized by adjusting the pressure within the chamber, by changing the chemical constituency of the vapor and/or by varying the duration of the exposure to the vapor. It has been found that limiting penetration to the depth of the irregularities will cause the irregularities to flow upon exposure to an elevated temperature whereby the surface roughness is decreased. The wafer is then heated at or above the surface Tg and below the Tg of the bulk photoresist to a temperature and time sufficient to decrease the degree of surface roughness initially present. The vacuum is then released and the processed wafers are removed from the chamber.

The following example is a detailed description of the methods of preparation and uses of the composition of the present invention. The detailed description falls within the scope of, and serves to exemplify, the more generally described methods set forth above. The example is presented for illustrative purposes only, and is not intended to limit the scope of the invention.

EXAMPLE 1

Figure 2A:
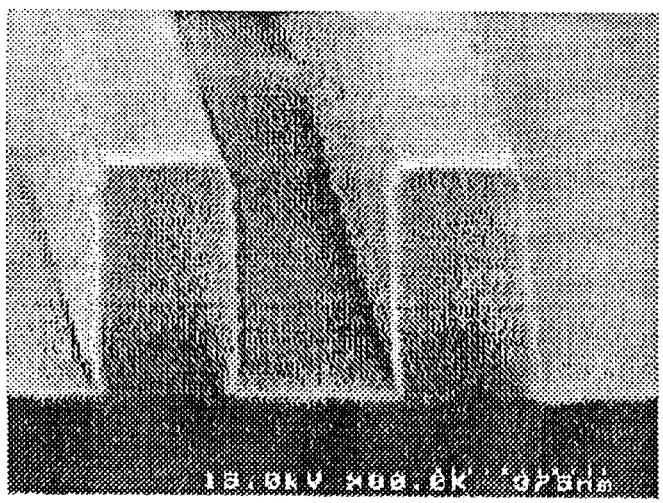
FIG. 2 shows pictorial views of scanning electron micrographs showing a cross sectional view of a 250 nm line processed in accordance one embodiment of the present invention.

In the following example, a DUV photoresist was coated over a bottom anti-reflective coating on multiple 8" silicon wafers. The bottom anti-reflective coating used in this example is known by the trade name AR3 and is commercially available from the Shipley Company. The photoresist is available under the trade name M20G and is commercially available from the JSR Microelectronics, Inc. Each wafer was patterned with a test reticle having various features using conventional lithography and developers. One wafer was cross sectioned and micrographs of the cross section were obtained using scanning electron microscopy. FIG. 2A is a pictorial view of the micrographs showing a cross sectional view of 250 nm lines after lithography. The profiles clearly show a significant roughness on the sidewalls of the patterned lines.

Figure 2B:
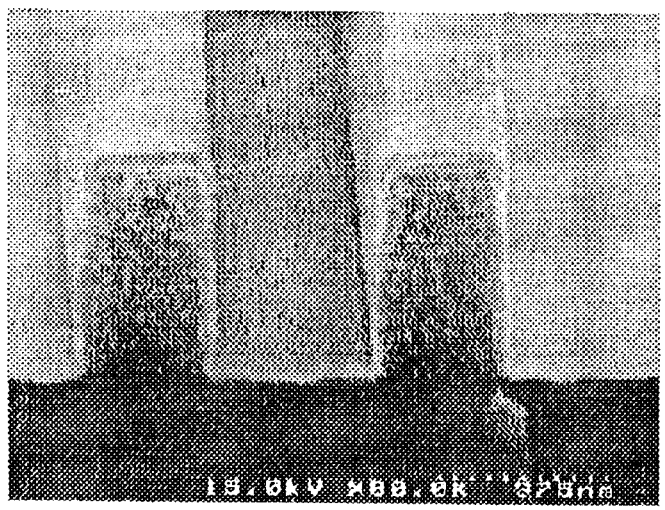

Two patterned wafers were then exposed to approximately 275 mW/cm$^2$ from an H-Mod bulb for 30 seconds. During the UV exposure the temperature of the wafers was increased from about 80° C. to about 120° C. After UV exposure the wafers were heated to about 140° C. for 60 seconds. One wafer was cross-sectioned and micrographs were obtained using scanning electron microscopy. FIG. 2B is a pictorial view of a micrographic cross sectional view of the 250 nm lines after exposure to UV radiation and heat. A small reduction in roughness is observed.

Figure 2C:

The single wafer that was exposed to UV radiation and heat was then exposed to a vapor generated from 2,3 dihydrofuran at approximately 250 torr for about 90 seconds at 90° C. After exposure to the vapor, the wafer was then heated to 140° C. for 60 seconds. The wafer was cross-sectioned and micrographs of the cross section were obtained using scanning electron microscopy. FIG. 2C is a pictorial view of the micrograph showing a cross sectional view of 250 nm lines after lithography. The profiles clearly show a significant reduction in roughness on the sidewalls of the patterned lines. The reduction in roughness is greater than the roughness observed after UV radiation and thermal processing.

Many modifications and variations of the invention will be apparent to those skilled in the art in light of the foregoing disclosure. Therefore, it is to be understood that, within the scope of the appended claims, the invention can be practiced otherwise than has been specifically shown and described.

We claim:

1. A process for reducing roughness from a surface of a patterned chemically amplified photoresist, the process comprising:
   a) exposing a substrate having patterned chemically amplified photoresist resulting from imaging and developing processing thereon to a vapor, wherein the vapor diffuses into the surface of the patterned photoresist;
   b) heating the substrate to a temperature and for a time sufficient to cause the surface of the patterned photoresist to flow wherein the surface roughness decreases;
   c) exposing the patterned photoresist to an activating radiation prior to, simultaneous with or subsequent to exposing the substrate to the vapor to form a compound, wherein the compound is reactive with the vapor; and
   d) reacting the vapor with the compound to form a polymer.

2. The process according to claim 1 wherein the compound is selected from the group consisting of a free radical, an acid, and a base.

3. The process according to claim 1 wherein the vapor is generated from a material selected from the group consisting of vinyl ethers, epoxides, acrylonitriles, furans, coumarins, indenes, styrenes, acrylate, aryl halides, halosilanes, alkynes, alkenes, cyclic ethers and sulfur dioxide.

4. The process according to claim 1 wherein the vapor reacts with the photoresist to increase a glass transition temperature for the photoresist surface relative to a glass transition temperature of bulk photoresist wherein the bulk photoresist is free from exposure to the vapor.

5. The process according to claim 1 wherein the vapor is 2,3-dihydrofuran.

6. The process according to claim 1 wherein the radiation that is used to expose the photoresist has a wavelength in the ultraviolet range.

7. The process according to claim 1 wherein the radiation that is used to expose the photoresist has a wavelength in the x-ray range.

8. The process according to claim 1 wherein the radiation consists of electrons generated from an electron beam.

9. The process according to claim 1 wherein the vapor is generated from a liquid with a boiling point less than about 200° C. at standard atmospheric conditions.

10. The process according to claim 1 wherein the vapor is a monomer selected from the group consisting of indenes, furans, vinyl ethers, epoxides, styrenes, acrylate, alkenes and alkynes.

11. A process for reducing roughness from a surface of a patterned photoresist, the process comprising:
    a) exposing a substrate having patterned photoresist resulting from imaging and developing processing thereon to a reactive vapor, wherein the vapor penetrates into the surface of the patterned photoresist;
    b) heating the substrate to a temperature and for a time sufficient to cause the surface of the patterned photoresist to flow wherein the surface roughness decreases; and
    c) polymerizing the reactive vapor within the photoresist by exposing the patterned photoresist to an activating energy whereby the vapor reacts in the patterned photoresist to form a compound.

12. The process according to claim 11 wherein the reactive vapor is selected from a material that reacts with a functional group on a polymer in the patterned photoresist.

13. The process according to claim 11 wherein the reactive vapor is selected from a material that reacts with a free radical in the patterned photoresist to form a nonvolatile compound.

14. The process according to claim 11 wherein the step of polymerizing the vapor comprises contacting the reactive vapor with an acid generated by the activating energy.

15. The process according to claim 11 wherein the step of polymerizing the vapor contacting the reactive vapor with a base generated by the activating energy.

16. The process according to claim 11 wherein the reactive vapor is a vinyl ether.

* * * * *